United States Patent
Kropfitsch et al.

(10) Patent No.: US 10,044,368 B2
(45) Date of Patent: Aug. 7, 2018

(54) SIGMA DELTA ANALOG TO DIGITAL CONVERTER

(71) Applicant: Infineon Technologies AG, Neubiberg (DE)

(72) Inventors: Michael Kropfitsch, Koettmannsdorf (AT); Massimo Rigo, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/716,252

(22) Filed: Sep. 26, 2017

(65) Prior Publication Data

US 2018/0115321 A1  Apr. 26, 2018

(30) Foreign Application Priority Data

Oct. 24, 2016 (DE) .......................... 10 2016 220 861

(51) Int. Cl.
  *H03M 3/00* (2006.01)
(52) U.S. Cl.
  CPC ........... *H03M 3/496* (2013.01); *H03M 3/464* (2013.01)
(58) Field of Classification Search
  CPC .............................. H03M 3/496; H03M 3/464
  USPC ................................................ 341/143, 155
  See application file for complete search history.

(56) References Cited

U.S. PATENT DOCUMENTS

| | | | | |
|---|---|---|---|---|
| 6,462,687 B1* | 10/2002 | Eshraghi | ............... | H03M 3/372 341/143 |
| 6,967,608 B1* | 11/2005 | Maloberti | ............. | H03M 3/388 341/143 |
| 7,061,416 B2* | 6/2006 | Nagai | ..................... | H03M 3/48 341/143 |
| 7,450,047 B1* | 11/2008 | Wu | ....................... | H03M 3/412 341/143 |
| 9,124,290 B2 | 9/2015 | Sherry et al. | | |
| 2014/0253354 A1 | 9/2014 | Quiquempoix | | |
| 2016/0048707 A1 | 2/2016 | Alladi et al. | | |

OTHER PUBLICATIONS

Office Action, in the German language, from counterpart German Application No. 102016220861.6, dated Jun. 29, 2017, 10 pp.

* cited by examiner

*Primary Examiner* — Brian Young
(74) *Attorney, Agent, or Firm* — Shumaker & Sieffert, P.A.

(57) ABSTRACT

A sigma delta analog to digital converter for converting an analog input into a digital output comprises a reference path for receiving a reference voltage. The reference path comprises a digital to analog converter. The digital to analog converter comprises a reference voltage input for receiving the reference voltage, wherein the reference voltage input comprises two contacts and wherein each contact is a beginning of a voltage line of two voltage lines. The digital to analog converter comprises a plurality of switches and a plurality of capacitors. The switches of the plurality of switches are configured to connect the digital to analog converter in a sampling phase with the reference voltage and to disconnect the digital to analog converter in an integrating phase from the reference voltage.

11 Claims, 4 Drawing Sheets

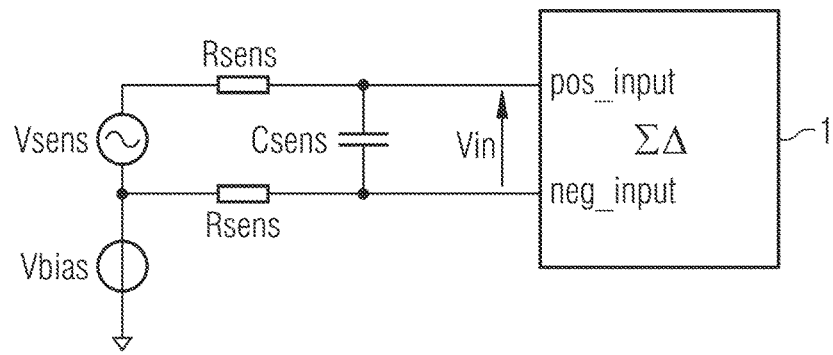
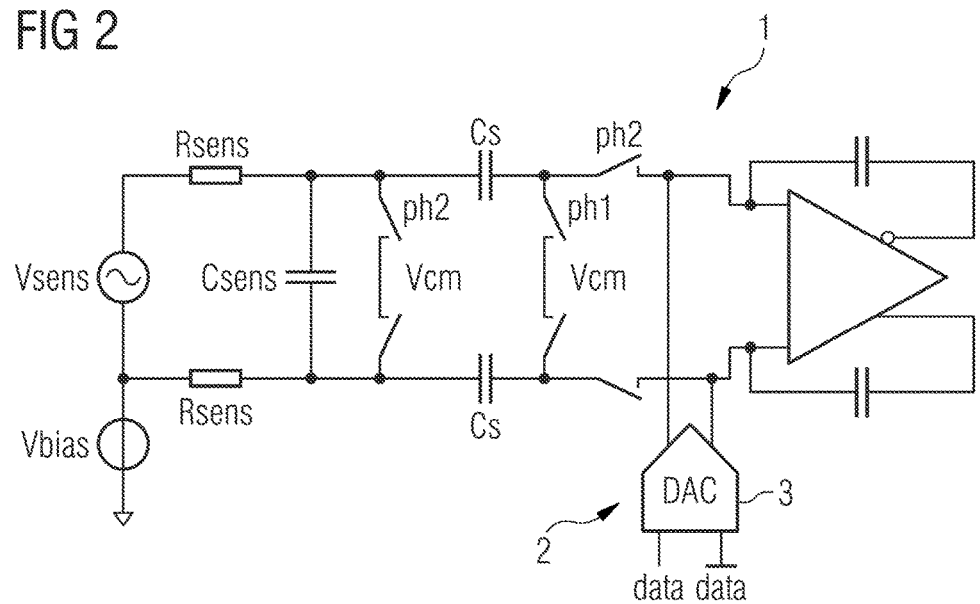

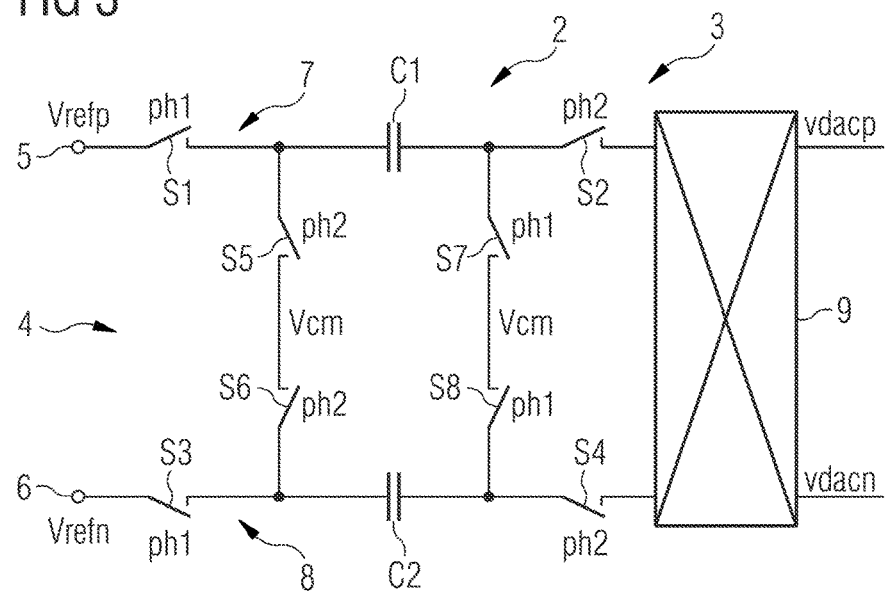
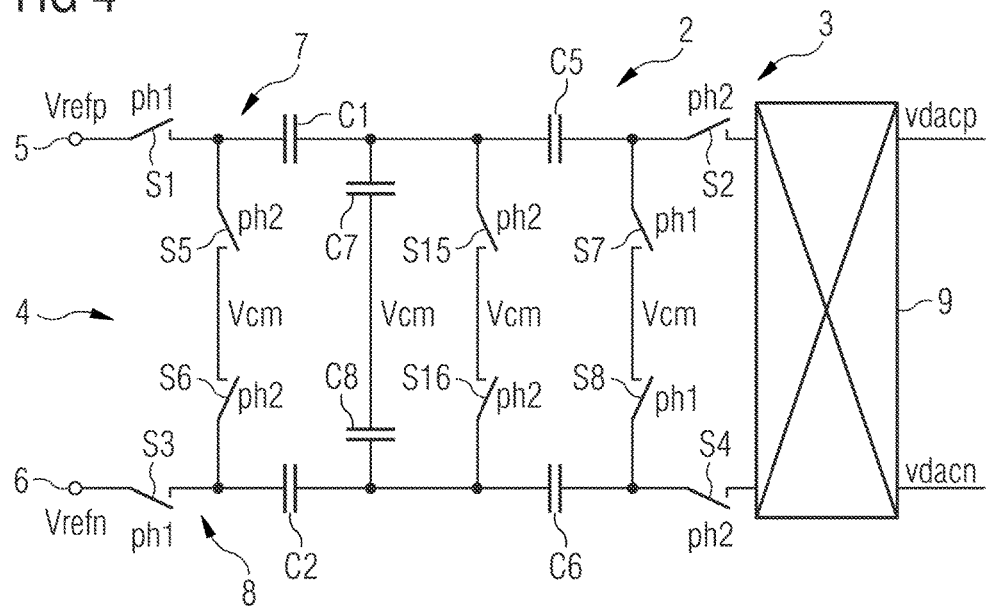

US 10,044,368 B2

SIGMA DELTA ANALOG TO DIGITAL CONVERTER

This Application claims priority to German Patent Application No. 102016220861.6 filed on Oct. 24, 2016, the entire content of which is incorporated by reference herein.

TECHNICAL FIELD

This disclosure relates in general to an analog to digital converter and more particularly to a sigma delta analog to digital converter.

BACKGROUND

Analog to digital converters (abbreviated as ADC, A/D, A-D, or A-to-D) convert analog signals into digital signals. A type of analog to digital converter is a sigma delta ADC (also known as a delta sigma ADC) that oversamples the desired signal and filters the incoming signal. The resulting output signal is fed back and subtracted from the input to the filter.

SUMMARY OF THE INVENTION

In an embodiment, a sigma delta analog to digital converter for converting an analog input into a digital output comprises a reference path for receiving a reference voltage. The reference path comprises a digital to analog converter that comprises a reference voltage input for receiving the reference voltage. The reference voltage input comprises two contacts, wherein each contact is a beginning of a voltage line of two voltage lines. The digital to analog converter comprises a plurality of switches and a plurality of capacitors. The switches of the plurality of switches are configured to connect the digital to analog converter in a sampling phase with the reference voltage input and to disconnect the digital to analog converter in an integrating phase from the reference voltage input. Further, the switches of the plurality of switches are configured to connect the capacitors of the plurality of capacitors with each other so that the connected capacitors have a total sampling capacity in the sampling phase and a total integrating capacity in the integrating phase.

The details of one or more embodiments are set forth in the accompanying drawings and the description below. Other features, objects, and advantages will be apparent for the description and drawings, and from the claims.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1 shows in an abstract way a sensor and an analog to digital converter.

FIG. 2 shows an embodiment of the circuit of FIG. 1 with details regarding the analog to digital converter having a digital to analog converter in the reference path for receiving a reference voltage.

FIG. 3 illustrates an embodiment of a part of a digital to analog converter of an analog to digital converter as, for example, shown in FIG. 2.

FIG. 4 illustrates a different embodiment of a part of the digital to analog converter of an analog to digital converter as, for example, shown in FIG. 2.

DETAILED DESCRIPTION OF ILLUSTRATIVE EMBODIMENTS

Figure 5:
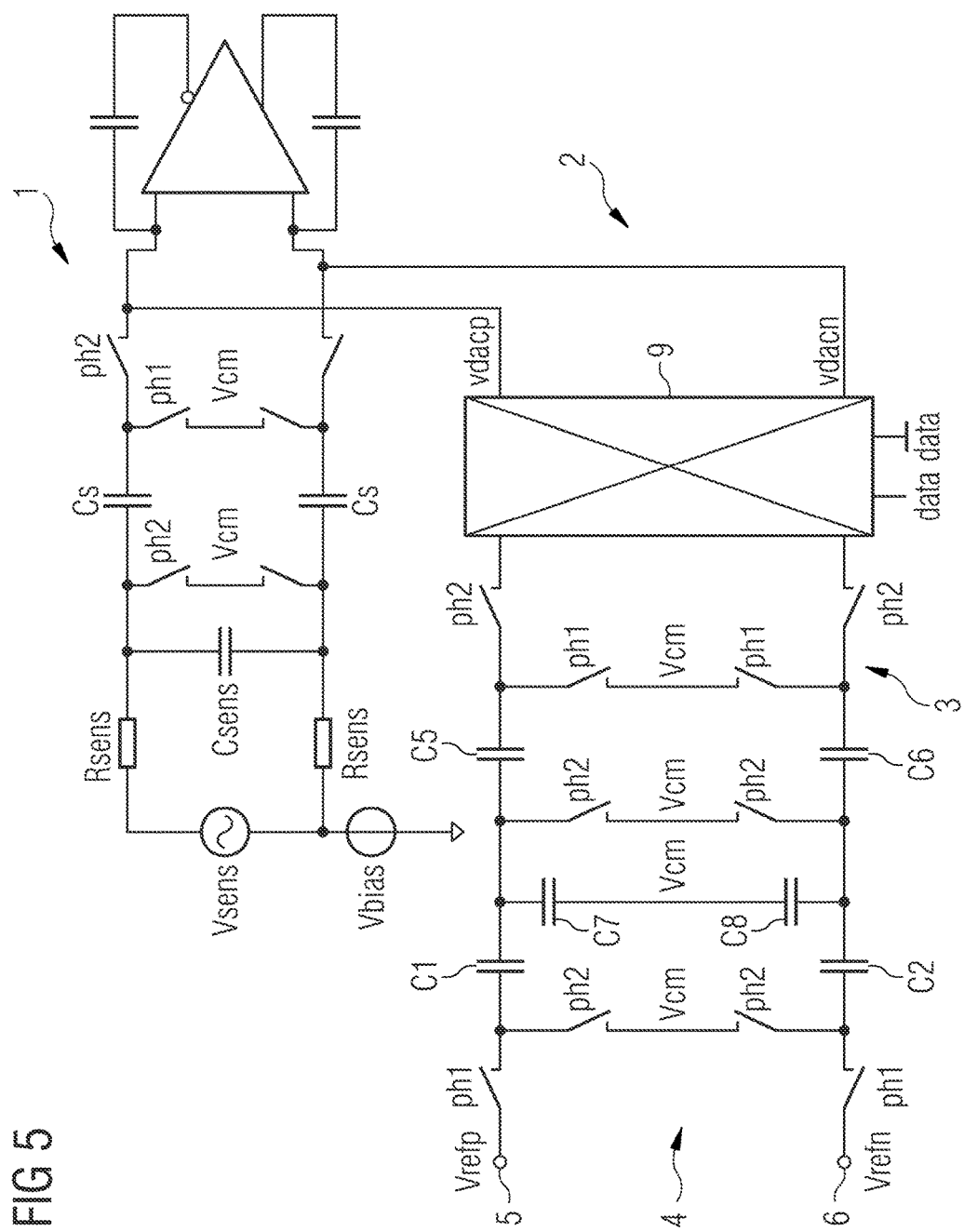
FIG. 5 illustrates a circuit for processing the voltage of a sensor using the digital to analog converter shown in FIG. 4.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the disclosure, and do not limit the scope.

FIG. 1 shows in an abstract way the processing of a voltage Vsens provided by a sensor. The voltage of the sensor is fed to the analog to digital converter input structure through the sensor equivalent impedance, here represented by the resistance Rsens and capacitance Csens. The resulting input voltage Vin is digitized by the sigma delta analog to digital converter 1 (named here: $\Sigma\Delta$). The sigma delta analog to digital converter 1 has two contacts for a positive and a negative input: pos_input and neg_input, respectively.

FIG. 2 illustrates an embodiment of a discrete time sigma delta analog to digital converter 1 for converting an analog input into a digital output. A reference path 2 allows receiving a reference voltage. Within the reference path 2 is integrated a digital to analog converter 3. The digital to analog converter or DAC 3 is, for example, a differential single bit DAC. The DAC 3 receives a datum and an inverted datum from a—not shown—quantizer of the sigma-delta modulator, for realizing the negative feedback in the first stage of the sigma delta modulator.

When a discrete time Sigma Delta Analog to Digital Converter (ADC) is used to digitize e.g. the output of a low voltage level sensor, a gain is typically implemented within the ADC to match the signal level to the full scale voltage level of the ADC. For discrete time delta sigma converters, this gain depends on the ratio between the sampling capacitor (Cs in FIG. 2) and the product of the reference voltage and the Digital to Analog Converter (DAC) capacitor, located in the feedback path of the ADC.

In applications where high Over Sampling Ratio (OSR) or high bandwidth are targeted, the sampling capacitor value is limited by the settling behavior. In such scenarios, implementing a signal gain is prohibitive because too small capacitor values for the DAC are required. That would lead to non-robust designs, due to poor matching. For sampling small voltages, big capacitors are used, which is as well avoided in scenarios involving high speed or high over sampling ratio (OSR) or the reference voltage is scaled down, which is impractical for high gains since the Signal to Noise Ratio (SNR) of the reference degrades accordingly. Moreover, it is impractical to realize a voltage buffer that is able to process such a small input voltage with acceptable performances.

An embodiment of the part of the digital to analog converter 3 for actually receiving the reference voltage is shown in FIG. 3. For receiving the reference voltage serves a reference voltage input 4 comprising two contacts 5, 6 that are here connected with Vrefp and Vrefn. At each contact 5, 6 starts one of the two voltage lines 7, 8. The voltage lines 7, 8 in this embodiment are connected with a chopper 9. A chopper circuit is a switching device that converts a DC input to a variable DC output voltage (here named vdacp and vdacn), according to a control signal (given by data in FIG. 2).

The two voltage lines 7, 8 have a similar design regarding their electronic elements wherein the switches of the plurality of switches S1, S2, S3, S4 and the capacitors of the plurality of capacitors C1, C2 are line symmetrical arranged along the voltage lines 7, 8. In both voltage lines 7, 8 the respective contact 5, 6 is followed by a switch S1, S3, a capacity C1, C2, and a second switch S2, S4. Both voltage lines 7, 8 are connected to each other via switches S5, S7, S6, S8. These switches S5, S7, S6, S8 also connect the two sides of the capacitors C1, C2 during the two different phases ph1 and ph2 with a common mode voltage Vcm that is common to all inputs connected to it and is well defined.

The switches are either closed for the sampling phase ph1: S1, S3, S7, S8 or during the integrating phase ph2: S2, S4, S5, S6 and are open during the other phase. In the sampling phase ph1, the digital analog converter 3 and especially the two capacitors C1, C2 are connected with the reference voltage input 4. The chopper 9 is disconnected from the capacitors C1, C2. In the integrating phase ph2, the digital analog converter 3 is disconnected from the reference voltage input 4 and the capacitors C1, C2 are connected with the chopper 9. This implies that the capacitors C1, C2 are charged during the sampling phase ph1 and that this charge is passed on to the chopper 9 in the integrating phase ph2.

The capacitors C1, C2 are connected in both phases ph1 and ph2 in series. Due to the arrangement, the connected capacitors C1, C2 have a total sampling capacity in the sampling phase ph1 that is identical to a total integrating capacity in the integrating phase ph2. Further, as here both capacitors C1, C2 have the same capacity C, and are in both phases ph1, ph2 connected in series, the total sampling capacity and the total integrating capacity equal C/2. From a different topological point of view, the total capacitance towards the common mode voltage Vcm is C for each input line.

In an embodiment, the capacitors of the plurality of capacitors and the switches of the plurality of switches are such arranged that at least two capacitors are connected in series in at least one of the sampling phase ph1 and the integrating phase ph2. In the following embodiment, the mentioned capacitors are in both phases ph1 and ph2 connected in series with each other. In a further embodiment, one capacitor of these at least two capacitors is connected with the two voltage lines and arranged between the two voltage lines. Hence, at least one capacitor does not belong to one of the two voltage lines but is connected with them and is such arranged in the middle between the two voltage lines.

In an embodiment, the capacitors of the plurality of capacitors are such arranged that at least two capacitors are arranged in series along each of the two voltage lines. Further, the capacitors of the plurality of capacitors are such arranged that at least one capacitor is connected with the two voltage lines. This at least one capacitor is arranged between the two voltages lines and is connected to a connection between the at least two capacitors arranged in series along the two voltage lines. In this embodiment, along each voltage line two capacitors are arranged in series. At least another—or fifth—capacitor (additionally to the at least two capacitors of each voltage line) is connected with both voltage lines and is arranged—so to say—in the middle between both voltage lines. This—fifth—capacitor is connected with a connection that connects the at least two capacitors belonging to the voltage lines. Hence, the arrangement of the fifth capacitor and the capacitors of each line is like the capital letter T (this can be seen in the following FIG. 4).

In an embodiment, the total sampling capacity resulting from the capacitors during the sampling phase equals the total integrating capacity resulting from the capacitors connected in the integrating phase.

FIG. 4 shows an embodiment of the digital to analog converter 3 within the reference path 2 of an sigma delta analog to digital converter.

The two contacts 5, 6 of the reference voltage input 4 are connected in the sampling phase ph1 by the switches S1, S7, S8, S3 with the capacitors C1, C5, C2, C6, C7, C8. Along the two voltage lines 7, 8 starting from the contacts 5, 6 the capacitors C1 and C5 for one voltage line 7 and capacitors C2 and C6 for the other voltage line 8 are connected in series. The other two capacitors C7 and C8 are also connected in series and both are connected with a common mode voltage Vcm between them. The capacitors C5 and C6 are also connected to the common mode voltage Vcm. This is done by the two switches S7 and S8.

The circuit shown in FIG. 4 may be described in the sampling phase ph1 as follows: The two capacitors C5 and C6 connected in series are connected in parallel with the two capacitors C7 and C8 which are also connected with each other in series. In a different—not shown—embodiment, the two capacitors C7 and C8 are realized by one capacitor having the corresponding capacity. The two capacitors C1 and C2 are arranged in series with the in parallel connected capacitors C5, C6, C7, C8.

For calculating the resulting capacities, the following example will be considered: The capacitors C1, C5, C2, C6 have the same capacity C. The other two capacitors C7 and C8 also have the same capacity which is given by k times the capacity C, i.e. k*C with k greater than 1. The resulting capacity of the capacitors C5 and C6 connected in series is given by C/2 and the resulting capacity of the two capacitors C7 and C8 in series is given by k*C/2. The capacity of the connection in parallel becomes: C/2*(k+1). This combined with the two capacitors C1 and C2 in series leads to a total sampling capacity given by C/2*((k+1)/(k+2)).

In the integrating phase ph2, the charge of the capacitors is transmitted to the rest of the digital to analog converter 3. For this purpose, the digital to analog converter 3 is disconnected from the reference voltage input 4 by opening the switches S1 and S3. Closed are the switches S5, S6, S15, S16, S2 and S4. Only the charge stored in C5 and C6 is actually transferred to the output of the digital to analog converter in the integrating phase, while the capacitors C1 and C2, C7 and C8 are discharged either to Vcm or mutually, due to symmetry of voltages and topology.

Assuming that C5, C6, C1, C2 are equal to C and C7, C8 are equal to k*C, then the total integrating capacitance is, against Vcm, C, or C/2 if C5 and C6 are seen as series connected. On the other hand, the total sampling capacitance against Vcm is C*((k+1)/(k+2)), or C/2*((k+1)/(k+2)) from the differential topology point of view. The structure of the embodiment shown in FIG. 4 actually makes the integrating capacitance slightly bigger than the sampling capacitance. A part of the stored charge is discharged to Vcm and not transferred during the integrating phase.

The switches S5, S6 and S15, S16 and S7, S8 are connecting in the respective phases the two voltage lines 7, 8 with a common mode voltage Vcm.

Thus, a T-cap structure is present in order to reduce the effective capacitance C/(k+2) compared to the used capacitor having a capacity C in the embodiment shown in FIG. 3.

Thus, the value of C in the DAC can be chosen in order to satisfy matching requirements, while still implementing the expected gain in the first stage of the Sigma Delta ADC. Further, if matching structures are used, accuracy scales with the dimensions of C, which is unrelated to the effective capacitance.

The charge transferred by the capacitors is: $Q(n)=(Vrefp-Vrefn)*data[n-1]*C/(k+2)$. Where Vrefp and Vrefn are the voltages present at the reference voltage input 4, C is the capacity of the capacitors C1, C2, C5, C6, and k is the factor describing the capacity of the capacitors C7 and C8 via k*C. The data[n−1] is the input received by the digital to analog converter 3 (compare FIG. 2) referring to a foregoing conversion step (n−1) for obtaining the current conversion step (n).

FIG. 5 shows an arrangement for processing the voltage of a sensor Vsens—as shown, for example, in FIG. 2—using an analog to digital converter 1 comprising a digital to analog converter 3 as shown in FIG. 4. The reference numerals for the switches are omitted due to legibility. The data and inverse data are fed to the chopper 9. It can be seen that the digital to analog converter 3 belongs to the reference path 2 which starts here at the reference voltage input 4 with the two contacts 5, 6.

Figure 6:
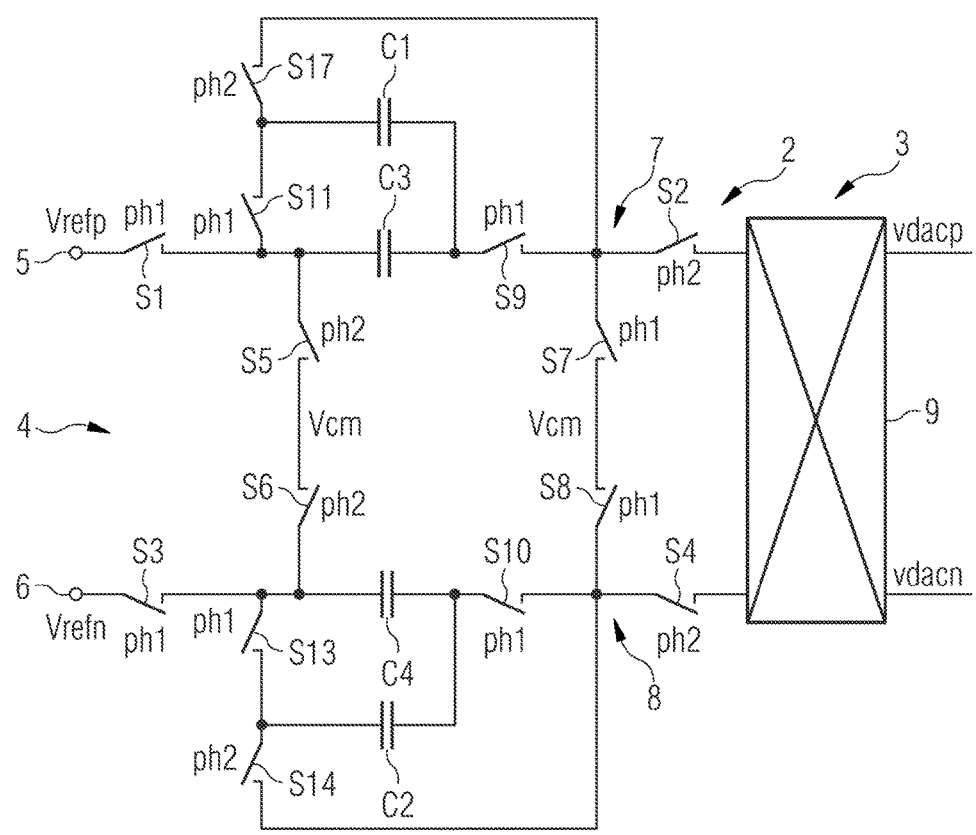
FIG. 6 illustrates another embodiment of a part of the digital to analog converter of an analog to digital converter as, for example, shown in FIG. 2.

FIG. 6 shows an embodiment of the digital to analog converter 3 belonging to the reference path 2 of a sigma delta analog to digital converter in which the total sampling capacity in the sampling phase ph1 differs from the total integrating capacity in the integrating phase ph2. Especially, in the shown embodiment the total sampling capacity is greater than the total integrating capacity. This is achieved in the shown embodiment by arranging capacitors (C1, C3 in one voltage line 7 and C2, C4 in the other voltage line 8) such that along at least one voltage line (here along both voltage lines) at least two capacitors (C1, C3; C2, C4) are connected in parallel in the sampling phase ph1 and are connected in anti-series in the integrating phase ph2. Here, due to the symmetrical design in both voltage lines 7, 8 two capacitors and the necessary switches are arranged to allow these two different connections (in parallel and in anti-series). In a different—not shown—embodiment, the capacitors are connected in parallel in the sampling phase ph1 and in series in the integrating phase ph2.

In the sampling phase ph1, switches S1, S11, S9 along one voltage line 7 and switches S3, S13, S10 are closed along the other voltage line 8. Further, by switches S7 and S8 both voltage lines 7, 8 are connected to a common mode voltage Vcm and with each other. The other switches S2, S4, S5, S6, S12, S14 are open. The ph1 and ph2 at each switch indicates the phase in which the respective switch is closed.

It can be seen that due to switch S11 the capacitors C1 and C3 and due to switch S13 capacitors C2 and C4 are connected in parallel to each other. Further, a connection with the reference voltage input 4 is realized and the capacitors are separated from the following parts of the digital to analog converter 3, here given by the chopper 9.

In the sampling phase ph2, switches S12 and S2 are closed along one voltage line 7 and switches S14 and S4 are closed along the other voltage line 8. The voltage lines 7, 8 are connected to each other and to a common mode voltage Vcm by switches S5 and S6. The remaining switches S1, S3, S7, S8, S9, S10, S11, S13 are open. The circuit is disconnected from the reference voltage input 4 and the capacitors are connected with the following components (shown is only the chopper 9) of the digital to analog converter 3. The capacitors C1 and C3 of one voltage line 7 and capacitors C2 and C4 of the other voltage line 8 are connected in anti-series.

For considering the effect of the kind of connection on the resulting total capacity, the capacitors C1 and C2, both, may have the capacity C, and the capacitors C3, C4 may have the capacity C+Ceq.

Thus, the capacitors of the combinations have different capacities: C and C+Ceq. In case of the sampling phase ph1, the resulting capacity for each combination of two capacitors (C1 and C3 are combined and C2 and C4 are combined) is due to the connection in parallel given by (C+Ceq)+C=2*C+Ceq. When both combinations are connected in series, the resulting total sampling capacity is given by (2*C+Ceq)/2. For the case of the integrating phase ph2, the resulting capacity becomes (C+Ceq)−C=Ceq. As both combinations are connected in series, the total integrating capacity is given by Ceq/2.

Hence, the total sampling capacity (C+Ceq/2) is greater than the total integrating capacity (Ceq/2). Thus, the resulting equivalent capacitor is much smaller than the physically used capacitors, which is here combined with a single bit discrete time DAC circuit. The charge transferred to the chopper 9 is given by: $Q(n)=(Vrefp-Vrefn)*data[n-1]*(C+Ceq-C)$.

The discussed sigma delta analog to digital converter with the described arrangement of capacitors and switches within the digital to analog converter allows to convert small input signals—stemming e.g. from sensors—without disadvantages mentioned above. This is done by using in an embodiment an analog circuitry embedded in the feedback digital to analog converter of a delta sigma converter, which scales down the charge sampled from the reference voltage source. This emulates a smaller capacitor then the used physical one or a smaller reference voltage. The advantage is a higher modulator gain to be implemented in high bandwidth or high OSR (Oversampling Ratio) discrete time modulators, interfacing low signal level sensors.

The mentioned switches are realized, for example, using field effect transistors, diodes, bipolar junction transistors, thyristors or any kind of relay.

An advantage is a broad input range concerning the input signal to be converted. This is achieved without requiring a buffer in front of the analog to digital converter which is usually required to bring the maximum input signal level to the ADC full-scale. This advantage results in a compact system and in less power consumption when the same performance in terms of noise and offset are targeted. The application of an embodiment of the discrete time sigma delta converter refers in one embodiment to high clock frequencies, e.g. greater than 50 MHz, and very low input levels.

Further advantages compared to other solutions for dealing with a small input signal are: Increasing the sampling capacitor requires a slower clock for the settling.

Using very small reference capacitors or voltages are usually not viable solutions as they suffer from poor matching and the inability to buffer very small voltages.

Lowering the reference voltage is limited by the operating conditions of the reference buffer output stage.

As the description refers to illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

The invention claimed is:

1. A sigma delta analog to digital converter for converting an analog input into a digital output,
    wherein the sigma delta analog to digital converter comprises a reference path for receiving a reference voltage,
    wherein the reference path comprises a digital to analog converter,
    wherein the digital to analog converter comprises a reference voltage input for receiving the reference voltage,
    wherein the reference voltage input comprises two contacts,
    wherein each contact is a beginning of a voltage line of two voltage lines,
    wherein the digital to analog converter comprises a plurality of switches and a plurality of capacitors,
    wherein the switches of the plurality of switches are configured to connect the digital to analog converter in a sampling phase with the reference voltage input and to disconnect the digital to analog converter in an integrating phase from the reference voltage input,
    wherein the switches of the plurality of switches are configured to connect the capacitors of the plurality of capacitors with each other so that the connected capacitors have a total sampling capacity in the sampling phase and a total integrating capacity in the integrating phase, and
    wherein the total sampling capacity differs from the total integrating capacity.

2. The sigma delta analog to digital converter of claim 1, wherein the switches of the plurality of switches and the capacitors of the plurality of capacitors are line symmetrical arranged along the voltage lines.

3. The sigma delta analog to digital converter of claim 1, wherein the total sampling capacity is greater than the total integrating capacity.

4. The sigma delta analog to digital converter of claim 1,
    wherein the capacitors of the plurality of capacitors and the switches of the plurality of switches are such arranged that at least two capacitors are connected in series in at least one of the sampling phase and the integrating phase, and
    wherein one capacitor of these at least two capacitors is connected with the two voltage lines and arranged between the two voltage lines.

5. The sigma delta analog to digital converter of claim 1, wherein the capacitors of the plurality of capacitors are such arranged that at least two capacitors are arranged in series along each of the two voltage lines and that at least one capacitor is connected with the two voltage lines and arranged between the two voltages lines and is connected to a connection between the at least two capacitors arranged in series along the two voltage lines.

6. The sigma delta analog to digital converter of claim 1, wherein the capacitors of the plurality of capacitors and the switches of the plurality of switches are such arranged that at least along one voltage line at least two capacitors are connected in parallel in the sampling phase and are connected in series or in anti-series in the integrating phase.

7. The sigma delta analog to digital converter of claim 6, wherein the two capacitors have different capacities.

8. The sigma delta analog to digital converter of claim 1, wherein switches of the plurality of switches are configured to connect capacitors of the plurality of capacitors with a common mode voltage.

9. The sigma delta analog to digital converter of claim 8, wherein the two voltage lines are connected with each other via the switches connecting capacitors with the common mode voltage.

10. A sigma delta analog to digital converter for converting an analog input into a digital output, the sigma delta analog to digital converter comprising:
    a digital to analog converter that comprises a plurality of switches, a plurality of capacitors, and a reference voltage input for receiving a reference voltage, wherein switches of the plurality of switches are configured to:
        connect the digital to analog converter in a sampling phase with the reference voltage input and disconnect the digital to analog converter in an integrating phase from the reference voltage input; and
        connect capacitors of the plurality of capacitors with each other so that the connected capacitors have a total sampling capacity in the sampling phase and a total integrating capacity in the integrating phase, wherein the total sampling capacity differs from the total integrating capacity.

11. A sigma delta analog to digital converter for converting an analog input into a digital output, the sigma delta analog to digital converter comprising:
    a digital to analog converter that comprises a plurality of switches, a plurality of capacitors, and a reference voltage input for receiving a reference voltage, wherein switches of the plurality of switches are configured to:
        connect the digital to analog converter in a sampling phase with the reference voltage input and disconnect the digital to analog converter in an integrating phase from the reference voltage input; and
        connect capacitors of the plurality of capacitors with each other so that the connected capacitors have a total sampling capacity in the sampling phase and a total integrating capacity in the integrating phase, wherein the total sampling capacity equals the total integrating capacity.

* * * * *